(12) United States Patent
King et al.

(10) Patent No.: US 8,178,436 B2
(45) Date of Patent: May 15, 2012

(54) ADHESION AND ELECTROMIGRATION PERFORMANCE AT AN INTERFACE BETWEEN A DIELECTRIC AND METAL

(75) Inventors: Sean King, Beaverton, OR (US); Jason Klaus, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/644,743

(22) Filed: Dec. 21, 2006

(65) Prior Publication Data

US 2008/0150145 A1 Jun. 26, 2008

(51) Int. Cl.
*H01L 21/4763* (2006.01)
*H01L 21/70* (2006.01)
*H01L 21/44* (2006.01)
*H01L 21/469* (2006.01)
*H01L 23/48* (2006.01)

(52) U.S. Cl. ........ 438/624; 438/643; 438/644; 438/680; 438/687; 438/791; 438/792; 257/506; 257/E23.011; 257/751; 257/753; 257/758; 257/760

(58) Field of Classification Search .................. 438/400, 438/643–644; 257/506, E23.011
See application file for complete search history.

(56) References Cited

U.S. PATENT DOCUMENTS

| | | | |
|---|---|---|---|
| 2005/0110153 A1* | 5/2005 | Wu et al. | 257/762 |
| 2006/0006543 A1* | 1/2006 | Shimazu et al. | 257/762 |
| 2006/0024879 A1* | 2/2006 | Fu et al. | 438/216 |
| 2006/0027924 A1* | 2/2006 | Chen et al. | 257/751 |
| 2006/0125028 A1* | 6/2006 | Chen et al. | 257/410 |
| 2006/0276027 A1* | 12/2006 | Lu et al. | 438/622 |
| 2007/0004049 A1* | 1/2007 | Nasu et al. | 438/3 |
| 2007/0034517 A1* | 2/2007 | Tsao et al. | 205/118 |
| 2007/0037388 A1* | 2/2007 | Hohage et al. | 438/675 |
| 2007/0063348 A1* | 3/2007 | Yang et al. | 257/751 |
| 2007/0077708 A1* | 4/2007 | Frohberg et al. | 438/257 |
| 2007/0085151 A1* | 4/2007 | Kotani | 257/393 |
| 2007/0205482 A1* | 9/2007 | Yang et al. | 257/499 |
| 2007/0296027 A1* | 12/2007 | Yang et al. | 257/327 |
| 2008/0122045 A1* | 5/2008 | Yang et al. | 257/642 |

OTHER PUBLICATIONS

Harald Brune, et al., "Effect of Strain on Surface Diffusion and Nucleation", Rapid Communications, Physical Review B, vol. 52, No. 20, Nov. 15, 1995, 6 pgs.

Y.X. Wang, et al., "Effect of Tensile Strain on Adatom Diffusion on Cu(1 1 1) Surface", Institute of Modern Physics, Fudan University, Shanghai 200433, China, 6 pgs.

M.W. Lane, et al., "Relationship Between Interfacial Adhesion and Electromigration in Cu Metallization", Journal of Applied Physics, vol. 93, No. 3, Feb. 1, 2003, 5 pgs.

* cited by examiner

*Primary Examiner* — Kevin Parendo
(74) *Attorney, Agent, or Firm* — Blakely, Sokoloff, Taylor & Zafman LLP (57) ABSTRACT

Interconnect structures having improved adhesion and electromigration performance and methods to fabricate thereof are described. A tensile capping layer is formed on a first conductive layer on a substrate. A compressive capping layer is formed on the tensile capping layer. Next, an interlayer dielectric layer is formed on the compressive capping layer. Further, a first opening is formed in the ILD layer using a first chemistry. A second opening is formed in the tensile capping layer and the compressive capping layer using a second chemistry. Next, a second conductive layer is formed in the first opening and the second opening.

14 Claims, 10 Drawing Sheets

ADHESION AND ELECTROMIGRATION PERFORMANCE AT AN INTERFACE BETWEEN A DIELECTRIC AND METAL

FIELD OF THE INVENTION

Embodiments of the invention relate generally to the field of semiconductor manufacturing, and more specifically, to dielectric/metal interfaces and methods and apparatuses to fabricate thereof.

BACKGROUND

Microelectronic devices, e.g., processors, memories, and other devices may be formed on a wafer that has multiple layers of integrated circuitry built on a silicon substrate. Typically, dielectric layers are deposited between the integrated circuitry layers of the wafer. The multiple integrated circuitry layers of the wafer may be connected through interconnect structures. For example, the interconnect structure may connect a copper line on one layer to the copper line on another layer of the wafer.

Currently, to improve bonding between the copper line and the upper dielectric layer, a single compressive dielectric layer is deposited between the copper line and the upper dielectric layer. Further, a selective electroless deposition of cobalt on the copper line may be used to improve adhesion between the copper line and the upper dielectric layer. The deposition of cobalt on the copper line is expensive and requires purchase and maintenance of an additional cobalt deposition tool.

The interface between the copper line and the upper dielectric layer, however, remains one of the weakest mechanical interfaces in interconnect structures and represents an easy path for crack generation, propagation and eventual mechanical failure.

Additionally, the poor bonding at the interface between the copper and the upper dielectric layer may enhance copper surface diffusion. The enhanced surface diffusion of copper along the copper/dielectric interface under an electric field (electromigration) results in a build up of a stress within the copper line that leads to de-bonding and eventual failure of the copper line.

BRIEF DESCRIPTION OF THE DRAWINGS

Embodiments of the invention may best be understood by referring to the following description and accompanying drawings that are used to illustrate embodiments of the invention. In the drawings.

DETAILED DESCRIPTION

In the following description, numerous specific details, for example, specific materials, structures, dimensions of the elements, processes, etc. are set forth in order to provide thorough understanding of one or more of the embodiments of the present invention. It will be apparent, however, to one of ordinary skill in the art that the one or more embodiments of the present invention may be practiced without these specific details. In other instances, semiconductor fabrication processes, techniques, materials, equipment, etc., have not been described in great details to avoid unnecessarily obscuring of this description. Those of ordinary skill in the art, with the included description, will be able to implement appropriate functionality without undue experimentation.

Reference throughout the specification to "one embodiment" or "an embodiment" means that a particular feature, structure, or characteristic described in connection with the embodiment is included in at least one embodiment of the present invention. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments.

Figure 1:
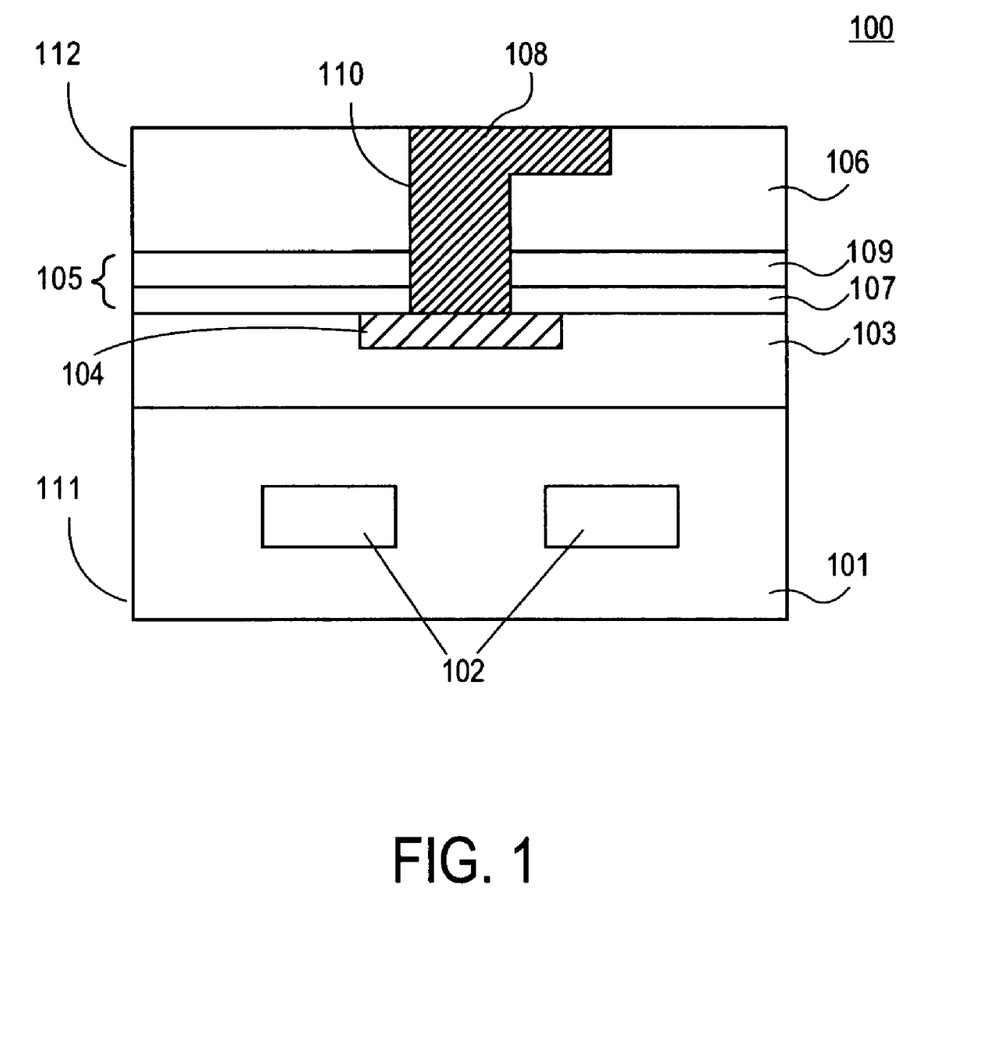
FIG. 1 shows a cross-sectional view of one embodiment of a wafer having an interconnect structure.

Interconnect structures having improved adhesion and electromigration performance and methods to fabricate thereof are described herein. FIG. 1 shows a cross-sectional view of one embodiment of a wafer having an interconnect structure. As shown in FIG. 1, a wafer 100 has a front end 111 that includes a substrate 101 and a back end 112 that includes an interconnect structure 110. In one embodiment, substrate 101 includes a monocrystalline silicon. In one embodiment, substrate 101 includes a silicon-on-insulator ("SOI"). Substrate 101 may include one or more metallization layers (not shown) of integrated circuits having active and passive devices 102, e.g., transistors, switches, optoelectronic devices, capacitors, resistors, interconnects. The one or more metallization layers of integrated circuits of substrate 101 may be separated from adjacent metallization layers by a dielectric material (not shown), e.g., interlayer dielectric. The adjacent metallization layers may be electrically interconnected by vias (not shown). Substrate 101 includes an interlayer dielectric ("ILD") layer 103, as shown in FIG. 1. In one embodiment, ILD layer 103 is a low-k dielectric, e.g., silicon dioxide, silicon oxide, carbon doped oxide ("CDO"), and any other dielectric material. In one embodiment, ILD layer 103 includes a nitride, oxide, a polymer layer, phosphosilicate glass, fluorosilicate ("SiOF") glass, organosilicate glass ("SiOCH"), or any combination thereof. In one embodiment, ILD layer 103 includes a spin-on low-k dielectric material. As shown in FIG. 1, a conductive layer 104 is formed in ILD layer 103. In one embodiment, conductive layer 104 includes a metal, e.g., copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), Vanadium (V), Molybdenum (Mo), palladium (Pd), gold (Au), silver (Au), platinum Pt, or any combination thereof.

As shown in FIG. 1, a backside interconnect structure 110 filled with a conductive material 108, e.g., a metal, is formed in an ILD layer 106. In one embodiment, interconnect structure 110 includes a via. In one embodiment, ILD layer 106 is a low-k dielectric, e.g., silicon dioxide, silicon oxide, carbon doped oxide ("CDO"), and any other dielectric material. In one embodiment, ILD layer 106 includes a nitride, oxide, a polymer layer, phosphosilicate glass, or any combination thereof. As shown in FIG. 1, backside interconnect structure 110 extends from the top surface of back end 112 through ILD layer 106 and a bi-layer 105 formed between conductive layer 104 and ILD layer 106 to provide an electrical connection to conductive layer 104. In one embodiment, bi-layer 105 is a tensile/compressive bi-layer dielectric film stack. In one embodiment, bi-layer 105 includes a capping layer having a tensile stress ("tensile capping layer") 107 deposited on conductive layer 104 and ILD layer 103, as shown in FIG. 1. Bi-layer 105 further includes a capping layer having a compressive stress ("compressive capping layer") 109 that is deposited on tensile capping layer 107, as shown in FIG. 1. In one embodiment, capping layers 107 and 109 are dielectric layers. In one embodiment, tensile layer 107 includes silicon nitride ("SiN"). In another embodiment, tensile layer 107 is SiC, $SiC_xN_{1-x}$, SiN, or any combination thereof. In one embodiment, compressive layer 109 includes SiN, silicon carbide nitride ("$SiN_xC_y$"), silicon carbide ("SiC"), boron nitride ("BN"), aluminum nitride ("AlN"), oxygen doped carbide ("SiOCH"), aluminum oxide ("$Al_2O_3$"), or any combination thereof. In one embodiment, compressive layer 109 is a $SiN_xC_{1-x}$, where x is in the approximate range of 0 to 1. In one embodiment, bi-layer 105 includes a $SiN_xC_y$ compressive layer having about 30% of carbon ("C") that is deposited on a tensile SiN layer. Tensile/compressive bi-layer 105 substantially increases adhesion at the interface between conductive layer 104 and ILD layer 106. Increased adhesion at the interface between conductive layer 104 and ILD layer 106 leads to a decrease in mechanical failures of wafer 100 including interconnect structure 110. In one embodiment, bi-layer 105 increases adhesion to copper conductive layer 104 by at least a factor of two. In one embodiment, the adhesion at the interface between conductive layer 104 and upper ILD layer 106 is estimated by measuring how much energy it takes to pull bi-layer 105 away from conductive layer 104. In one embodiment, the adhesion of bi-layer 105 to copper conductive layer 104 is at least twice greater than the adhesion of a single compressive dielectric layer to the copper layer. In one embodiment, the adhesion of bi-layer 105 to copper conductive layer 104 is at least about 25 joule per square meter ("$J/m^2$"). In one embodiment, the adhesion of bi-layer 105 to dielectric layer 103 is at least 30% greater than the adhesion of the single compressive layer to the dielectric layer. In one embodiment, the adhesion of bi-layer 105 to dielectric layer 106 is at least about 8 $J/m^2$. In one embodiment, bi-layer 105 provides an increased adhesion between dielectric layer 106 and conductive layer 104 and dielectric layer 103 while preventing wafer 100 from being bowed, as described in further detail below with respect to FIGS. 2A-2R, and 3A-3C. In one embodiment, tensile layer 107 and compressive layer 109 act as etch stop layers, as described in further details below with respect to FIGS. 2A-2R.

Figure 2A:
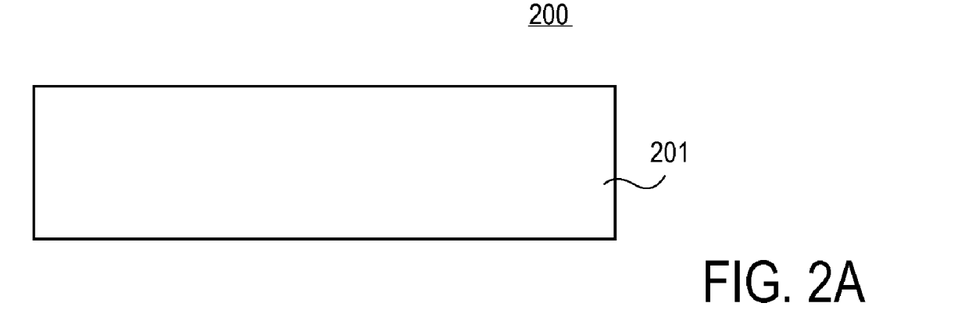
FIG. 2A shows one embodiment of a substrate to fabricate an interconnect structure.

Improved adhesion at the interface between conductive layer 104 and dielectric layer 103 increases the amount of electromigration derived stress required to de-bond the conductive layer 104 from dielectric 103 and increases a lifetime of wafer 100. Tensile/compressive bi-layer 105 via tensile layer 107 adds a tensile stress at the surface of conductive layer 104 that can increase a distance between lattice cells at the surface of conductive layer 104. The increased distance between the lattice cells at the surface of conductive layer 104 may decrease the surface diffusivity of the conductor material (e.g., copper). Decreasing the surface diffusivity of the conductor material may decrease the electro-migration. In one embodiment, interconnect structure 110 is used for electrical power delivery to one or more devices 102 through one or more other interconnects (not shown), and for input/output connections of wafer 100. In one embodiment, tensile dielectric layer 107 and compressive dielectric layer 109 are deposited over conductive layer 104 during a single processing operation using the same deposition tool at the same time. Fabrication of the interconnect structure using the tensile/compressive bi-layer is described in further detail below with respect to FIGS. 2A-2R, and 3A-3C. FIG. 2A shows a view 200 of one embodiment of a substrate to fabricate an interconnect structure.

In one embodiment, substrate 201 includes a monocrystalline silicon. In one embodiment, substrate 201 includes a silicon-on-insulator ("SOI"). For alternate embodiments, substrate may comprise compound semiconductors, e.g., indium phosphide, gallium arsenide, gallium nitride, silicon germanium, and silicon carbide. In another embodiment, substrate 201 may include e.g., glass, and quartz. Substrate 201 may include one or more metallization layers of integrated circuits having active and passive devices, e.g., transistors, switches, optoelectronic devices, capacitors, resistors, interconnects (not shown). The one or more metallization layers of integrated circuits of substrate 201 may be separated from adjacent metallization layers by a dielectric material (not shown), e.g., interlayer dielectric. The adjacent metallization layers may be electrically interconnected by vias (not shown).

Figure 2B:
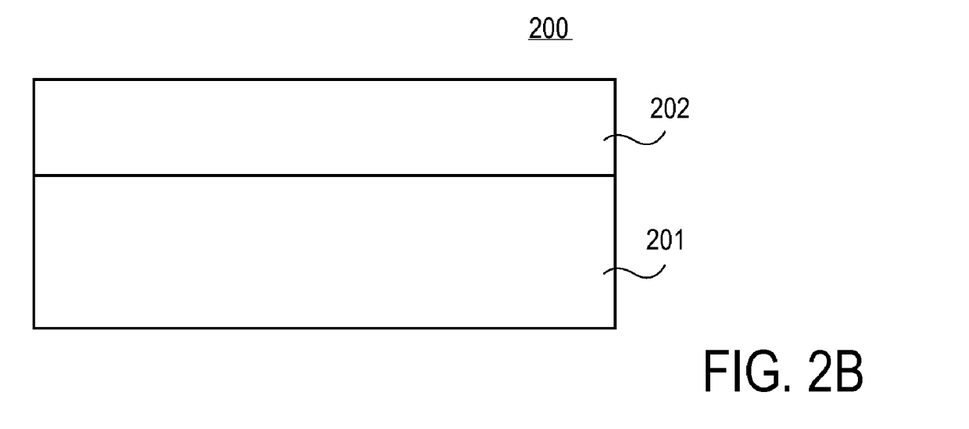
FIG. 2B is a view similar to FIG. 2A, after an interlayer dielectric ("ILD") layer is deposited on the substrate.

FIG. 2B is a view 200 similar to FIG. 2A, after an interlayer dielectric ("ILD") layer 202 is deposited on substrate 201. In one embodiment, ILD layer 202 is a low-k dielectric, e.g., silicon dioxide, silicon oxide, and carbon doped oxide ("CDO"), or any combination thereof. In one embodiment, ILD layer 202 includes a nitride, oxide, a polymer, phosphosilicate glass, fluorosilicate ("SiOF") glass, organosilicate glass ("SiOCH"), or any combination thereof. In one embodiment, ILD layer 202 includes a spin-on low-k dielectric material. In one embodiment, ILD layer 202 is silicon dioxide. In another embodiment, dielectric layer 202 is silicon nitride. ILD layer 202 may be deposited using any suitable deposition technique. In one embodiment, ILD layer 202 may be deposited using blanket deposition technique, for example, chemical vapor deposition ("CVD"), sputtering, spin-on, or another thin film deposition technique. In one embodiment, ILD layer 202 is deposited to the thickness in the approximate range of 100 nm to 2 μm.

Figure 2C:
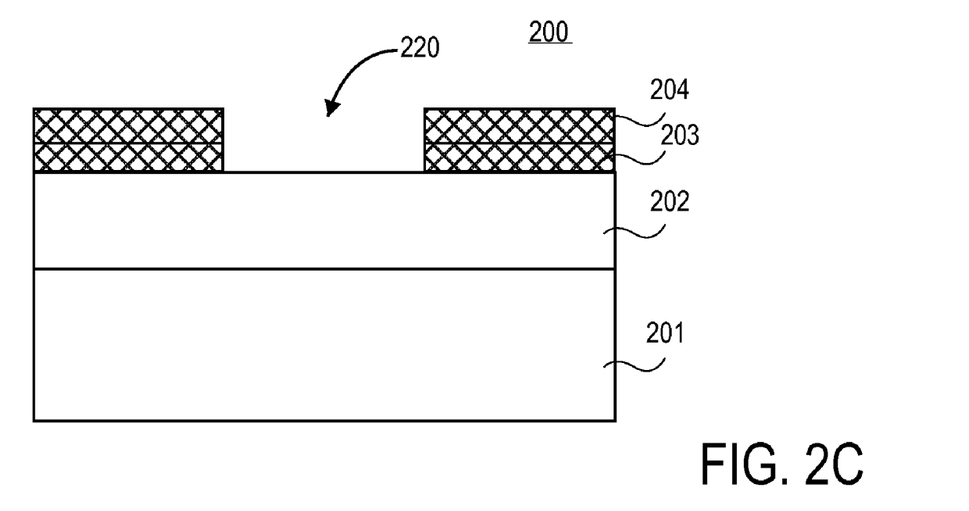
FIG. 2C is a view similar to FIG. 2B, after a photoresist layer is deposited over the ILD layer to form an opening in the ILD layer.

FIG. 2C is a view 200 similar to FIG. 2B, after a photoresist layer 204 is deposited over ILD layer 202 to form an opening in ILD layer 202. In one embodiment, photoresist layer 204 is deposited on a hard mask layer 203 formed on ILD layer 202, as shown in FIG. 2C. In another embodiment, photoresist layer 204 is deposited directly onto ILD layer 202. As shown in FIG. 2C, photoresist layer 204 and hard mask layer 203 are patterned and etched to form an opening 220. Patterning and etching of the photoresist and hard mask is known to one of ordinary skill in the art of microelectronic device manufacturing. Patterning and etching of the photoresist may be performed using one of the techniques known to one of ordinary skill in the art of microelectronic device manufacturing. The technique may include masking the photoresist layer, exposing the masked layer to light, and then developing the unexposed portions to remove the portions of the photoresist layer that are exposed to light to form a window in the photoresist layer. In one embodiment, the process of exposing to light and removing the photoresist layer may be performed in a plasma reactor. The opening in hard mask 204 may be etched to expose a portion of ILD layer 202 using a dry etching, e.g., reactive ion etching ("RIE"), wet etching, or any combination thereof techniques.

Figure 2D:
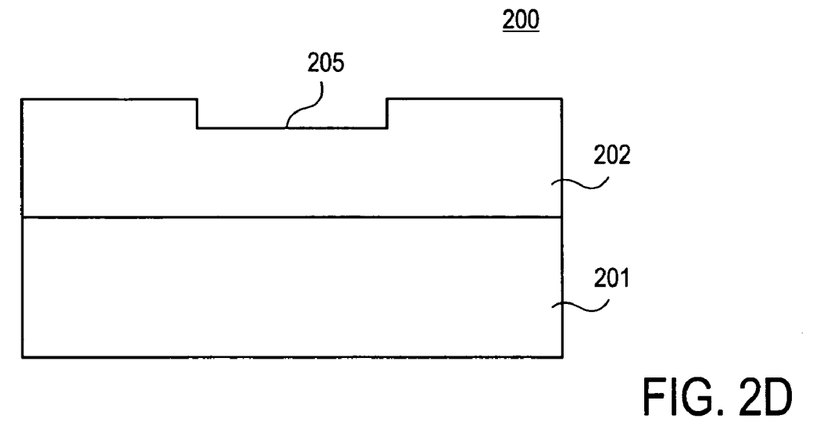
FIG. 2D is a view similar to FIG. 2C, after an opening is formed in the ILD layer.

FIG. 2D is a view 200 similar to FIG. 2C, after an opening 205 is formed in ILD layer 202. In one embodiment, opening 205 is etched through opening 220 in hard mask 203. In another embodiment, opening 205 is formed by etching ILD layer through an opening in patterned photoresist 203 deposited directly onto ILD layer 202. In one embodiment, opening 205, e.g., a trench, may be formed using an anisotropic dry etching, e.g., plasma etching. In another embodiment, opening 205 is formed using dry etching, wet etching, or a combination thereof techniques known to one of ordinary skill in the art of microelectronic device manufacturing. In one embodiment, opening 205 in ILD layer 202 has the width in the approximate range of 0.05 microns ("μm") to 5 μm, and the depth in the approximate range of 0.05 μm to 10 μm. In one embodiment, the size of openings 205 is determined by the size of a conductive line formed within ILD 202 later on in the process.

After forming opening 205, the photoresist and hard mask are removed. Removing of the photoresist and the hard mask from ILD layer 202 is known to one of ordinary skill in the art of microelectronic device manufacturing. In one embodiment, the photoresist and hard mask may be removed using a chemical technique, mechanical technique, or both.

Figure 2E:
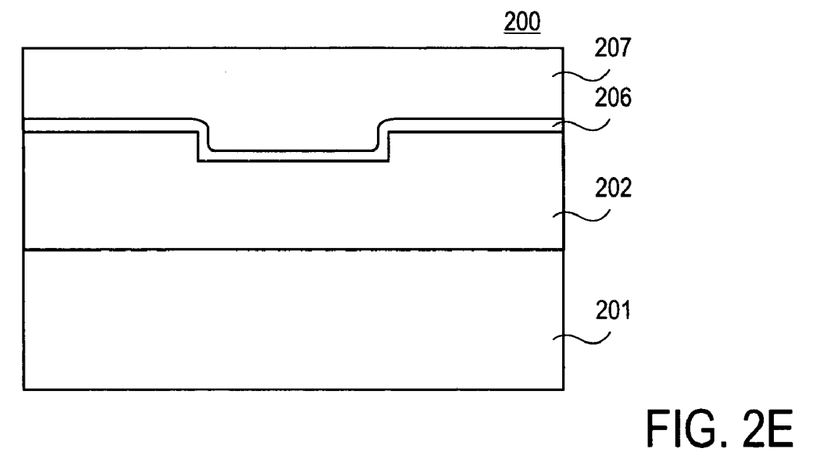
FIG. 2E is a view similar to FIG. 2D, after a conductive layer is deposited over the ILD layer filling the opening.

FIG. 2E is a view 200 similar to FIG. 2D, after a conductive layer 207 is deposited over ILD layer 202 filling opening 205. In one embodiment, a base layer 206 is first deposited on ILD layer 202 covering the internal sidewalls and bottom of opening 205. As shown in FIG. 2E, conductive layer 207 is deposited on base layer 206. In one embodiment, base layer 206 includes a conductive seed layer (not shown) deposited on a conductive barrier layer (not shown). In one embodiment, the seed layer includes copper, and the conductive barrier layer includes aluminum, titanium, tantalum, tantalum nitride, and the like metals. The conductive barrier layer is used to prevent diffusion of the conductive material from the seed layer, e.g., copper, into ILD 202. Additionally, the conductive barrier layer is used to provide adhesion for the seed layer (e.g., copper). In one embodiment, to form base layer 206, the conductive barrier layer is deposited onto ILD layer 202 covering the sidewalls and bottom of opening 205, and the seed layer is deposited on the conductive barrier layer. In another embodiment, conductive base layer 206 includes the seed layer that is directly deposited onto dielectric layer 202 covering the sidewalls and bottom of opening 205. Each of the conductive barrier layer and seed layer may be deposited using any thin film deposition technique known to one of ordinary skill in the art of semiconductor manufacturing, e.g., by sputtering, blanket deposition, and the like. In one embodiment, each of the conductive barrier layer and the seed layer has the thickness in the approximate range of 10 to 300 nm. As shown in FIG. 2E, conductive layer 207 is deposited onto conductive base layer 206.

As shown in FIG. 2E, conductive layer 207 fills opening 205 and covers portions of base layer 206 outside of opening 205 that are on top of ILD layer 202. In one embodiment, conductive layer 207 e.g., copper, is deposited onto the seed layer of base layer 206, e.g., copper, by an electroplating process. In one embodiment, conductive layer 207 is deposited into opening 205 using a damascene process that is known to one of ordinary skill in the art of microelectronic device manufacturing. In one embodiment, conductive layer 207 is deposited onto the seed layer using one of selective deposition techniques known to one of ordinary skill in the art of semiconductor manufacturing, e.g., electroplating, electroless plating, and the like. In one embodiment, the choice of a material for conductive layer 207 determines the choice of a material for the seed layer. For example, if the material for conductive layer 207 includes copper, the material for the seed layer also includes copper. In one embodiment, conductive layer 207 includes e.g., copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), Vanadium (V), Molybdenum (Mo), palladium (Pd), gold (Au), silver (Au), platinum Pt, or any combination thereof.

Figure 2F:
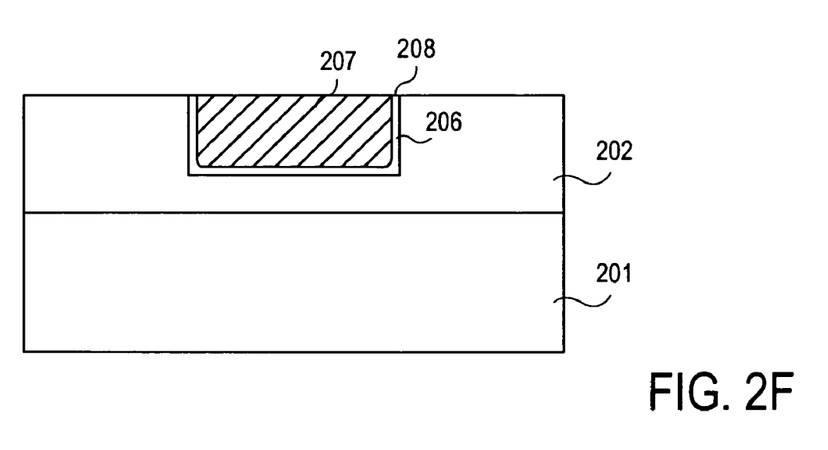
FIG. 2F is a view similar to FIG. 2E, after portions of the conductive layer are removed from the top surface of the ILD layer outside the opening to form a patterned conductive line within the opening.

FIG. 2F is a view similar to FIG. 2E, after portions of conductive layer 207 and base layer 206 are removed from the top surface of ILD layer 202 outside opening 205 to form a patterned conductive line 208 within opening 205. Portions of conductive layer 207 may be removed chemically, e.g., using etching, mechanically, e.g., using polishing, or by a combination of thereof techniques, e.g., using a chemical-mechanical polishing ("CMP") technique known to one of ordinary skill in the art of microelectronic device manufacturing. In one embodiment, one or more patterned conductive lines are formed within ILD layer 202 using methods described above. In another embodiment, the conductive line is formed by patterning and etching of the conductive layer deposited on the top surface of ILD layer 202. Patterning and etching of the conductive layer deposited on the top surface of the ILD layer 202 is known to one of ordinary skill in the art of microelectronic device manufacturing. In one embodiment, the thickness of conductive line 208 is in the approximate range of 0.025 μm to 1 μm.

Figure 2G:
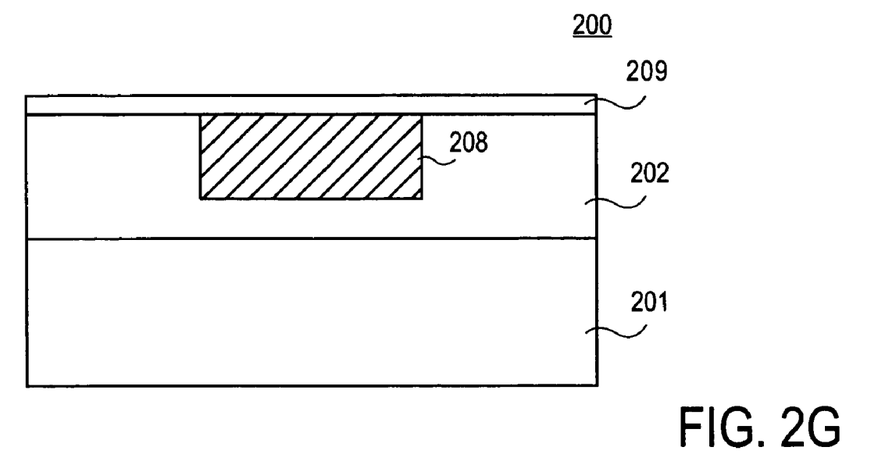
FIG. 2G is a view similar to FIG. 2F, after a thin tensile capping layer is deposited on conductive line.

FIG. 2G is a view 200 similar to FIG. 2F, after a thin tensile capping layer 209 of a bi-layer is deposited on conductive line 208. Tensile capping layer 209 is deposited to improve adhesion at the interface between the conductive line 208 and another dielectric layer formed over conductive line 208 later on in the process. As shown in FIG. 2G, tensile dielectric capping layer 209 is deposited on conductive line 208 and on the top surface of ILD layer 202. In one embodiment, tensile capping layer 209 is a silicon nitride ("SiN") layer. In one embodiment, tensile capping layer 209 is deposited using a plasma enhanced chemical vapor deposition ("PECVD") technique using the plasma source driven by a first radio ("RF") frequency from a first RF source in the approximate range of 10 MegaHertz ("MHz") to 15 MHz. In one embodiment, the first RF frequency of the plasma source is about 13.56 MHz. In one embodiment, tensile capping layer 209 is formed on copper conductive line 208 to the thickness in the approximate range of 10 angstroms ("Å") to 200 Å. In one embodiment, tensile capping layer 209 has a tensile stress from about 50 megapascals to about 900 megapascals.

In one embodiment, thin tensile capping layer 209 is deposited on conductive line 208 immediately after forming patterned conductive line 208, without pre-treatment of the conductive line 208. In one embodiment, the adhesion of the bi-layer deposited onto conductive line 208 without plasma pre-pretreatment is at least the same as the adhesion of the single compressive layer deposited onto the conductive line with the plasma pre-treatment.

In another embodiment, before depositing of thin tensile capping layer 209, a plasma pre-treatment is performed to remove, for example, any residual organics left on the surface of the wafer after the CMP and to remove surface oxides that may be formed on the conductive line 208. In another embodiment, the adhesion of the bi-layer deposited onto the conductive line with plasma pre-pretreatment is greater than the adhesion of the single compressive layer deposited onto the conductive line with the plasma pre-treatment.

Figure 3A:
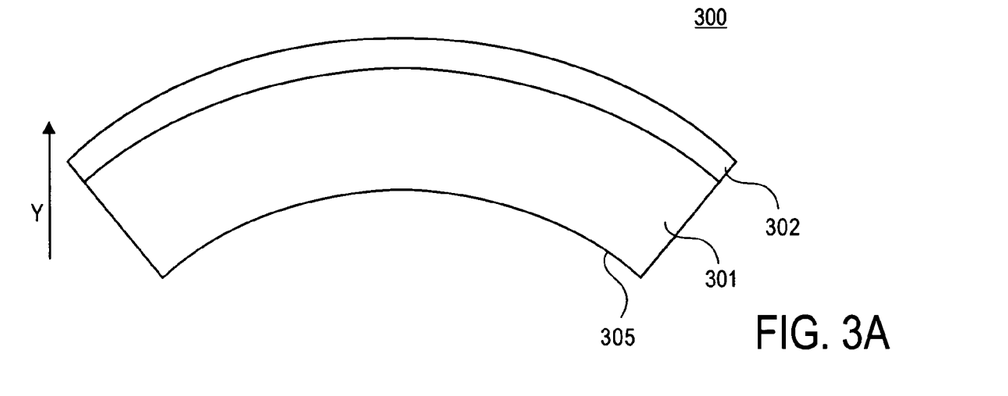
FIG. 3A shows a cross-sectional view of one embodiment of a wafer having a tensile capping layer deposited on a substrate 301.

FIG. 3A shows a cross-sectional view of one embodiment of a wafer having a tensile capping layer 302 deposited on substrate 301, as described above. In one embodiment, substrate 301 includes a monocrystalline silicon. In one embodiment, the thickness of substrate 301 is in the approximate range of 100 μm to 1 mm. The tensile capping layer 302 is described above with respect to FIG. 1. As shown in FIG. 3A, depositing of tensile capping layer 302 on substrate 301 may result in a bow of wafer 300 in direction Y depicted by arrow. As shown in FIG. 3A, wafer 300 has a bow, such that a top surface 304 of the wafer 300 is greater than a bottom surface 305 of wafer 300. In one embodiment, a bow of wafer 300 is estimated relative to the bow of a wafer having bare substrate 301. If the absolute value of bow of wafer 310 is larger than the bow of bare substrate 301, then the wafer bow has a non-neutral status.

Figure 3B:
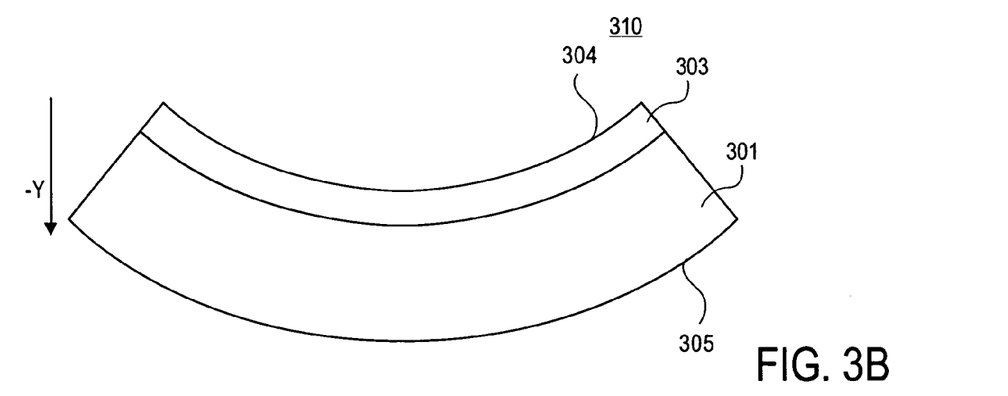
FIG. 3B shows a cross-sectional view of one embodiment of a wafer having a compressive capping layer deposited on a substrate.

FIG. 3B shows a cross-sectional view of one embodiment of a wafer having a single compressive capping layer 301 deposited on substrate 301. In one embodiment, substrate 301 includes a monocrystalline silicon. The compressive capping layer 303 is described above with respect to FIG. 1. As shown in FIG. 3B, depositing of compressive capping layer 303 on substrate 301 may result in a bow of wafer 300 in direction −Y depicted by arrow. The direction −Y is opposite to the direction Y shown in FIG. 3A. As shown in FIG. 3B, wafer 310 has a bow, such that a top surface 304 of the wafer 310 is smaller than a bottom surface 305 of wafer 310. In one embodiment, a bow of wafer 310 is estimated relative to the bow of bare substrate 301. If the absolute value of bow of wafer 310 is larger than the bow of bare substrate 301, then the wafer bow has a non-neutral status.

Figure 3C:
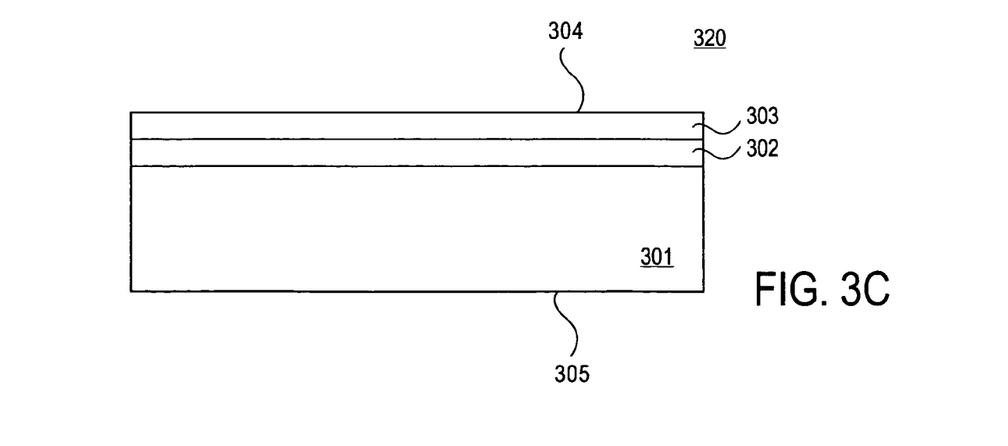
FIG. 3C shows a cross-sectional view of one embodiment of a wafer having a compressive capping layer deposited on a tensile capping layer on a substrate.

FIG. 3C shows a cross-sectional view of one embodiment of a wafer having a compressive capping layer 303 deposited on tensile capping layer 302 on substrate 301. In one embodiment, substrate 301 includes a monocrystalline silicon. The tensile and compressive capping layers 302 and 303 are described above with respect to FIG. 1. As shown in FIG. 3C, depositing of compressive capping layer 303 on top of tensile layer 302 compensates for the wafer bow and restores the wafer bow to a neutral status. As shown in FIG. 3C, wafer 320 does not have a bow such that top surface 304 of wafer 320 has the same size as the bottom surface 305 of wafer 320. In one embodiment, a bow of wafer 330 is estimated relative to the bow of bare substrate 301. In one embodiment, if the absolute value of bow of wafer 330 is less or equal to the bow of bare substrate 301, then the wafer bow has the neutral status. Generally, the magnitude of the bow of the wafer is proportional to the stress in the capping layer and the thickness of the capping layer. For example, the larger the stress in the capping layer, the smaller the thickness of the capping layer is needed to maintain the same bow of the wafer. By measuring the bow of the wafer, the thickness of each of the tensile and compressive capping layers can be adjusted such to maintain the wafer bow to the neutral status.

Figure 2H:
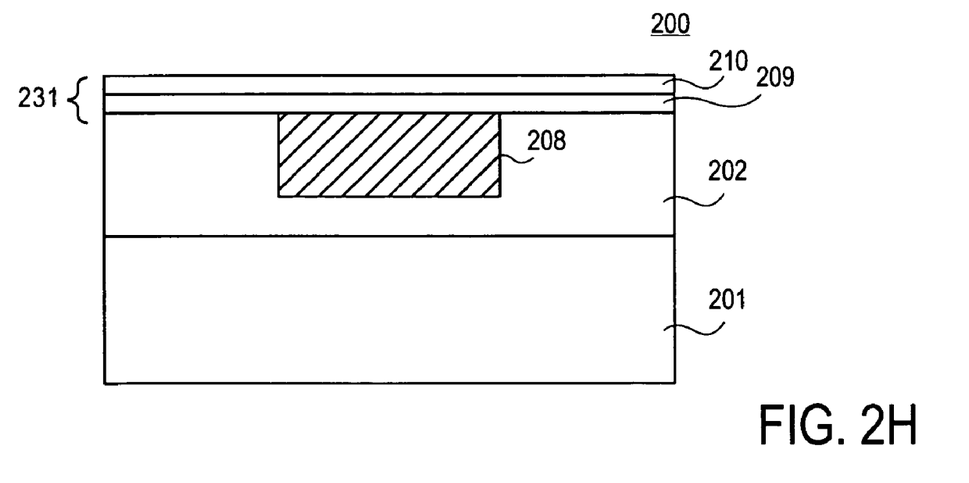
FIG. 2H is a view similar to FIG. 2G, after a thin compressive capping layer is deposited on the thin tensile capping layer 209.

Referring back to FIG. 2G, a compressive capping layer of the bi-layer is formed on thin tensile capping layer 209. FIG. 2H is a view 200 similar to FIG. 2G, after a thin compressive capping layer 210 is deposited on thin tensile capping layer 209 to form a bi-layer 231. Thin compressive capping layer 210 is deposited on thin tensile capping layer 209 to maintain the wafer bow at a neutral status. In one embodiment, compressive capping layer 210 includes SiN, silicon carbide nitride ("$SiN_xC_y$"), silicon carbide ("SiC"), boron nitride ("BN"), aluminum nNitride ("AlN"), oxygen doped carbide ("SiOCH"), aluminum oxide ("$Al_2O_3$"), or any combination thereof. In one embodiment, compressive capping layer 210 is a $SiN_xC_{1-x}$, where x is in the approximate range of 0 to 1. In one embodiment, compressive capping layer 210 includes a $SiN_xC_y$ having about 30% of carbon ("C"). In one embodiment, compressive capping layer 210 is deposited using a PECVD technique with a plasma source driven with a second RF frequency. In one embodiment, compressive capping layer 210 is deposited using PECVD with the plasma source driven with the first RF frequency and the second RF frequency. In one embodiment, compressive capping layer 210 is deposited using the first RF frequency from the first RF source in the approximate range of 10 Megahertz ("MHz") to 15 MHz, e.g., about 13.5 MHz, and the second RF frequency from a second RF source in the approximate range of 50 kilohertz ("kHz") to 700 kHz. In one embodiment, tensile capping layer 209 and compressive capping layer 210 are deposited using one or more RF frequencies that drive one or more plasma sources in a PECVD process. In one embodiment, tensile capping layer 209 is deposited using a single RF frequency, and compressive capping layer 210 is deposited using at least two RF frequencies. In one embodiment, compressive capping layer 210 has a compressive stress from about 50 Megapascals to one Gigapascal. In one embodiment, both capping layers 209 and 210 are deposited using PECVD at a temperature in the approximate range of 300° C. to 400° C. and a pressure in the approximate range of 1 torr to 10 torr. In one embodiment, compressive capping layer 210 having the thickness in the approximate range of 100 angstroms (Å)

to about 2000 Å is deposited on tensile capping layer 209 having the thickness in the approximate range of 10 Å to about 200 Å.

Figure 2I:
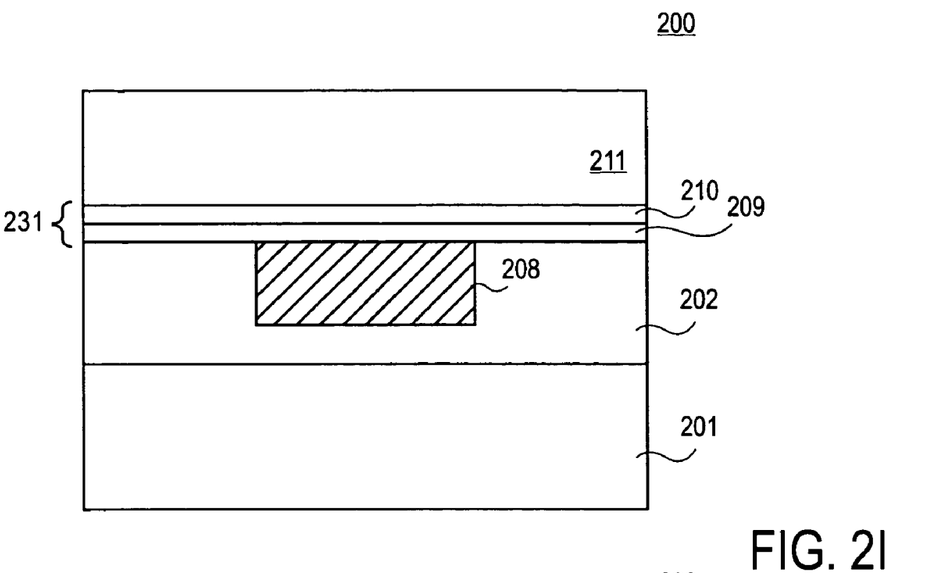
FIG. 2I is a view similar to FIG. 2H, after an interlayer dielectric layer is deposited on the compressive capping layer.

FIG. 2I is a view 200 similar to FIG. 2H, after an interlayer dielectric ("ILD") layer 211 is deposited on compressive capping layer 210. In one embodiment, ILD layer 211 is a low-k dielectric, e.g., silicon dioxide, silicon oxide, carbon doped oxide ("CDO"), or any combination thereof. In one embodiment, ILD layer 211 includes a nitride, oxide, a polymer layer, phosphosilicate glass, fluorosilicate ("SiOF") glass, organosilicate glass ("SiOCH"), or any combination thereof. In one embodiment, ILD layer 211 includes a spin-on low-k dielectric material. In one embodiment, ILD layer 211 is silicon dioxide. In another embodiment, dielectric layer 211 is silicon nitride. ILD layer 211 may be deposited using any suitable deposition technique. In one embodiment, ILD layer 211 may be deposited using a blanket deposition technique, for example, chemical vapor deposition ("CVD"), sputtering, spin-on, or another thin film deposition technique. The thickness of ILD layer 211 is such that the wafer bow is maintained at a neutral status. In one embodiment, ILD layer 211 is deposited to the thickness in the approximate range of 100 nm to 2 um. In one embodiment, compressive capping layer 210 compensates for the bow of tensile ILD layer 211 and tensile layer 209.

Figure 2J:
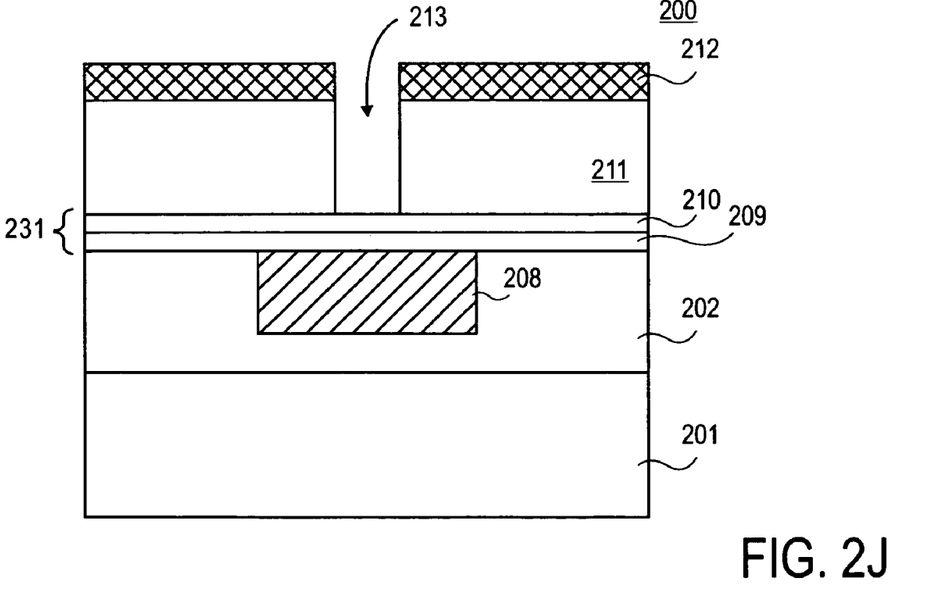
FIG. 2J is a view similar to FIG. 2I, after an opening is formed in an ILD layer.

FIG. 2J is a view 200 similar to FIG. 2I, after an opening 213 is formed in ILD layer 211.

As shown in FIG. 2J, opening 213 is formed through an opening in a hard mask 212 deposited on ILD layer 211. In one embodiment, hard mask 212 includes an oxide, nitride, carbide, metal, or any combination thereof. In one embodiment, to form opening 213, a photoresist (not shown) deposited on hard mask 212 is patterned and etched to form the opening in hard mask 212. Patterning and etching of the photoresist may be performed using one of the techniques known to one of ordinary skill in the art of microelectronic device manufacturing. The technique may include masking the photoresist layer, exposing the masked layer to light, and then developing the unexposed portions to remove the portions of the photoresist layer that are exposed to light to form a window in the photoresist layer. In one embodiment, the process of exposing to light and removing the photoresist layer may be performed in a plasma reactor. One having ordinary skill in the art will appreciate that other photoresist techniques may also be used. The opening in hard mask is etched to expose a portion of ILD layer 211 using a dry etching, e.g., reactive ion etching ("RIE"), wet etching, or any combination thereof techniques.

To form opening 213, the portion of ILD layer 211 exposed through the opening in hard mask 212 is etched down to bi-layer 231 that acts as an etch stop layer. In one embodiment, the portion of ILD layer 211 exposed through the opening in hard mask 212 is etched down to compressive layer 210, wherein each of compressive layer 210 and tensile layer 209 acts as an etch stop layer. In one embodiment, opening 213 in ILD layer 211 is formed using a first chemistry having substantially high selectivity to bi-layer 231. In one embodiment, the first chemistry includes helium ("He"), argon ("Ar"), and various halogenated gases. In one embodiment, the first chemistry has the ratio of the etching rate of the ILD layer 211 to bi-layer 231 of at least 6:1. In one embodiment, the portion of ILD layer 211 exposed through the opening in hard mask 212 may be removed using dry etching, e.g., plasma etching, RIE. In another embodiment, ILD layer 211 is removed using a dry etching, wet etching, or any combination thereof techniques known to one of ordinary skill in the art of microelectronic device manufacturing.

In one embodiment, opening 213 includes a via. In one embodiment, opening 213 has the diameter in the approximate range of 0.50 nm to 1 μm, and the depth in the approximate range of 100 nm to 2 μm. In one embodiment, opening 213 has an aspect ratio of the depth to the diameter in the approximate range of 5:1 to 100:1. After forming of opening 213, the photoresist and hard mask 212 are removed. Removing of the photoresist and the hard mask from the ILD layer is known to one of ordinary skill in the art of microelectronic device manufacturing. In one embodiment, the photoresist and hard mask may be removed chemically, mechanically, or by a combination thereof techniques.

In another embodiment, opening 213 is formed though an opening in a patterned and etched photoresist (not shown) directly deposited onto ILD layer 211.

Figure 2K:
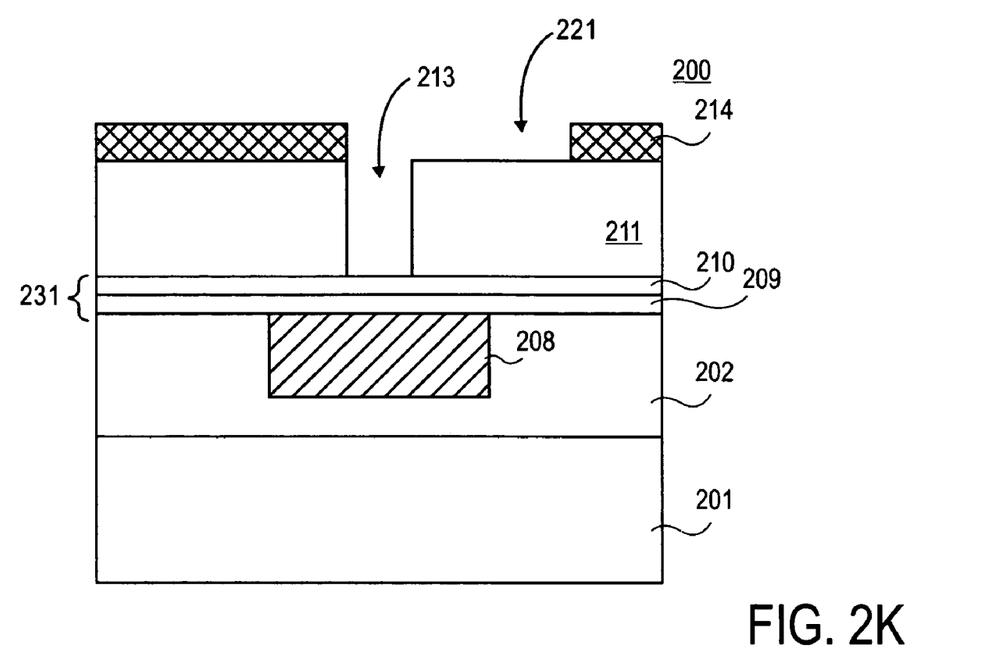
FIG. 2K is a view similar to FIG. 2J, after another hard mask is deposited onto an ILD layer according to one embodiment of the invention.

FIG. 2K is a view 200 similar to FIG. 2J, after another hard mask 214 is deposited onto ILD layer 214 according to one embodiment of the invention. In one embodiment, hard mask 214 includes an oxide, nitride, carbide, metal, or any combination thereof. In one embodiment, a photoresist (not shown) deposited on hard mask 214 is patterned and etched to form on opening 221 in hard mask 214. Patterning and etching of the photoresist and hard mask 214 may be performed using any of the techniques known to one of ordinary skill in the art of microelectronic device manufacturing.

Figure 2L:
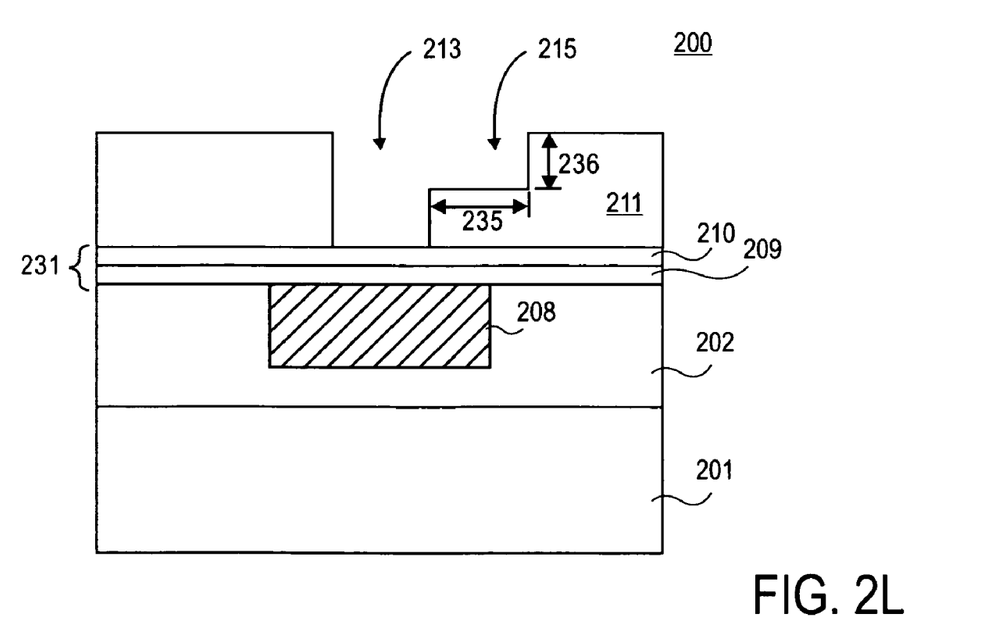
FIG. 2L is a view similar to FIG. 2K, after a portion of the ILD layer is removed to form an opening.

FIG. 2L is a view 200 similar to FIG. 2K, after another portion of ILD layer 211 exposed through the opening in hard mask 214 is removed to form opening 215. As shown in FIG. 2L, opening 215 includes a trench that extends horizontally within ILD layer 211 from via opening 213. In one embodiment, opening 215 is formed using dry etching, e.g., a plasma etching, RIE. In another embodiment, opening 215 is formed using a dry etching, wet etching, or any combination thereof techniques known to one of ordinary skill in the art of microelectronic device manufacturing. In one embodiment, opening 215 has width 235 in the approximate range of 0.05 μm to 50 μm, and depth 236 in the approximate range of 0.05 μm to 50 μm. After forming of opening 215, the photoresist and hard mask 214 are removed. Removing of the photoresist and the hard mask from the ILD layer is known to one of ordinary skill in the art of microelectronic device manufacturing. In another embodiment, opening 214 is formed using a patterned and etched photoresist (not shown) directly deposited onto ILD layer 211.

Figure 2M:
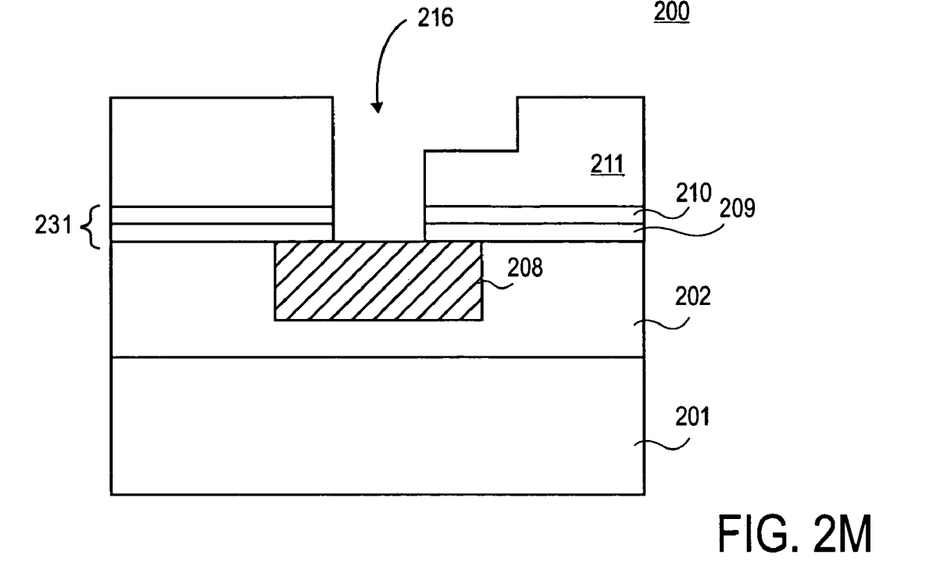
FIG. 2M is a view similar to 2L, an opening is formed through the bi-layer.

FIG. 2M is a view 200 similar to 2L, opening 216 is formed through bi-layer 231 down to conductive line 208. In one embodiment, to form opening 216, a portion of bi-layer 231 exposed through opening 215 is etched down to conductive line 208. In one embodiment, the portion of bi-layer 231 is etched using dry etching, wet etching, or any combination thereof techniques. In one embodiment, the portion of bi-layer 231 is etched using a dry plasma etching technique with a second chemistry having substantially high selectivity to the material of conductive line 208. In one embodiment, the second chemistry has the ratio of the etching rates of the bi-layer 231 to the material of conductive line 208 is approximately 10:1. In one embodiment, the second chemistry to selectively etch bi-layer 231 includes He, Ar, nitrogen ("$N_2$"), and various halogenated gases. In another embodiment, a dry etching, wet etching, or a combination thereof techniques may be used to selectively etch bi-layer 231 to form opening 216.

Figure 2N:
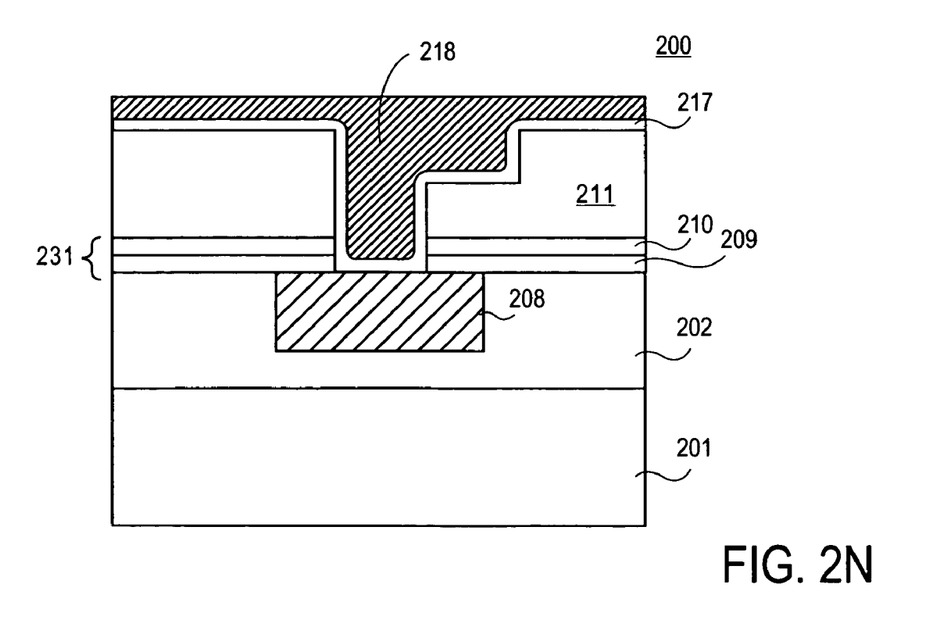
FIG. 2N is a view similar to FIG. 2M, after a conductive layer is deposited into the opening to form an interconnect structure according to one embodiment of the invention.
Figure 2O:
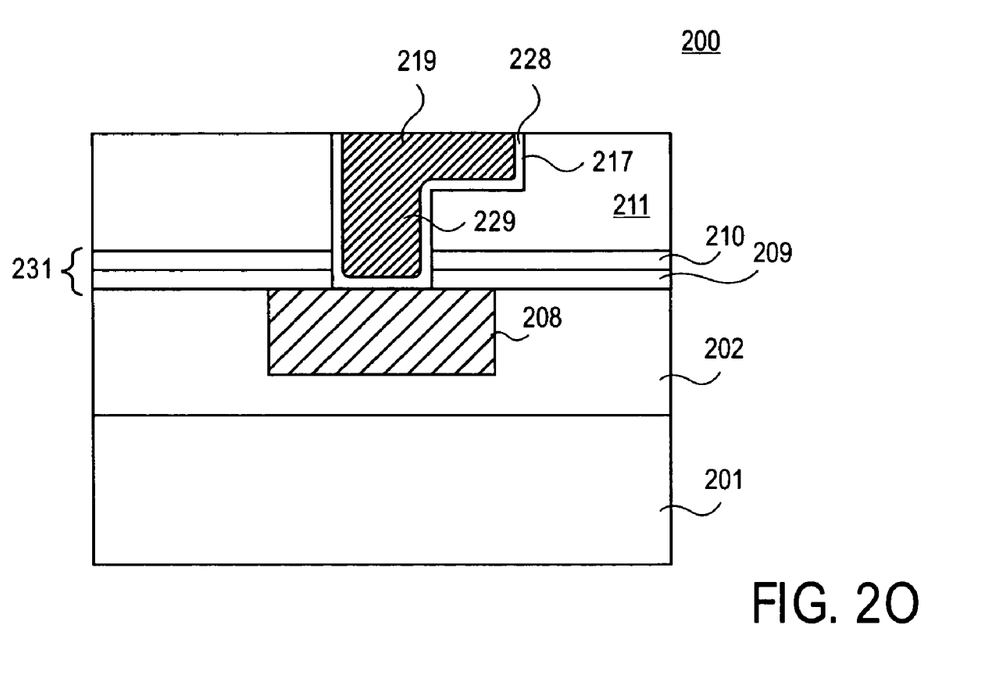
FIG. 2O is a view similar to FIG. 2N, after portions of the conductive layer and base layer are removed from the top surface of the ILD layer outside the opening to form an interconnect structure according to one embodiment of the invention.
Figure 2P:
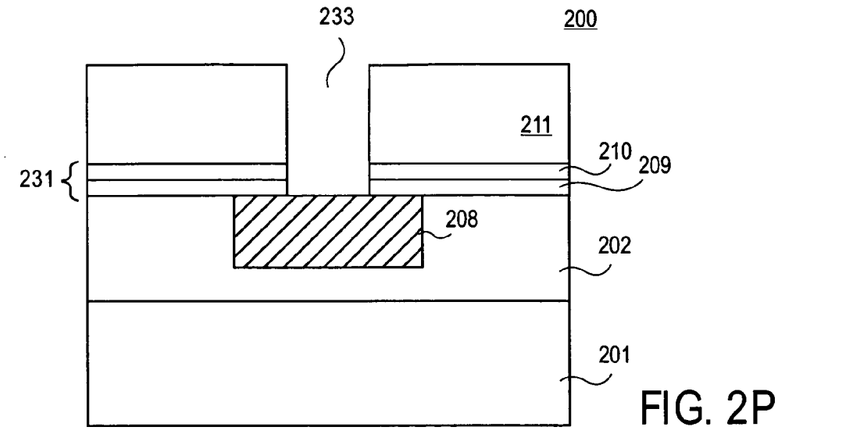
FIG. 2P is a view similar to FIG. 2K, after an opening in the bi-layer is formed according to another embodiment of the invention.

FIG. 2P is a view 200 similar to FIG. 2K, after an opening in bi-layer 231 is formed according to another embodiment of the invention. As shown in FIG. 2P, an opening 233 in bi-layer 231 down to conductive layer 208, as described above with respect to FIG. 2M, is formed directly after forming opening 213.

FIG. 2N is a view 200 similar to FIG. 2M, after a conductive layer 218 is deposited into opening 216 to form an interconnect structure according to one embodiment of the invention. In one embodiment, a base layer 217 is first deposited over ILD layer 211 that covers the internal sidewalls and bottom of opening 216. As shown in FIG. 2N, the internal sidewalls of opening 216 include portions of ILD layer 211, bi-layer 231, and conductive layer 208. Next, conductive layer 218 is deposited on base layer 217. In one embodiment, base layer 217 includes a conductive seed layer (not shown) deposited on a conductive barrier layer (not shown). In one embodiment, the seed layer includes copper, and the conductive barrier layer includes aluminum, titanium, tantalum, tantalum nitride, and the like metals. The conductive barrier layer is used to prevent diffusion of the conductive material from the seed layer, e.g., copper, into ILD 211 and into bi-layer 231. Additionally, the conductive barrier layer is used to provide adhesion for the seed layer (e.g., copper). In one embodiment, to form base layer 217, the conductive barrier layer is first deposited onto ILD layer 211 covering the sidewalls and bottom of opening 216, and the seed layer is deposited on the conductive barrier layer. In another embodiment, conductive base layer 217 includes the seed layer that covers the internal sidewalls and bottom of opening 216. Each of the conductive barrier layer and seed layer may be deposited using any thin film deposition technique known to one of ordinary skill in the art of semiconductor manufacturing, e.g., by sputtering, blanket deposition, and the like. In one embodiment, each of the conductive barrier layer and the seed layer has the thickness in the approximate range of 10 to 300 nm. As shown in FIG. 2N, conductive layer 218 fills opening 216 and covers portions of base layer 217 outside of opening 216 that are on top of ILD layer 211. In one embodiment, conductive layer 218 e.g., copper, is deposited onto the seed layer of base layer 217, e.g., copper, by an electroplating process. In one embodiment, conductive layer 218 is deposited into opening 216 using a damascene process that is known to one of ordinary skill in the art of microelectronic device manufacturing. In one embodiment, conductive layer 218 is deposited onto the seed layer using one of selective deposition techniques known to one of ordinary skill in the art of semiconductor manufacturing, e.g., electroplating, electroless plating, and the like. In one embodiment, the choice of a material for conductive layer 218 determines the choice of a material for the seed layer. For example, if the material for conductive layer 218 includes copper, the material for the seed layer also includes copper. In one embodiment, conductive layer 218 includes e.g., copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), Vanadium (V), Molybdenum (Mo), palladium (Pd), gold (Au), silver (Au), platinum Pt, or any combination thereof.

Figure 2Q:
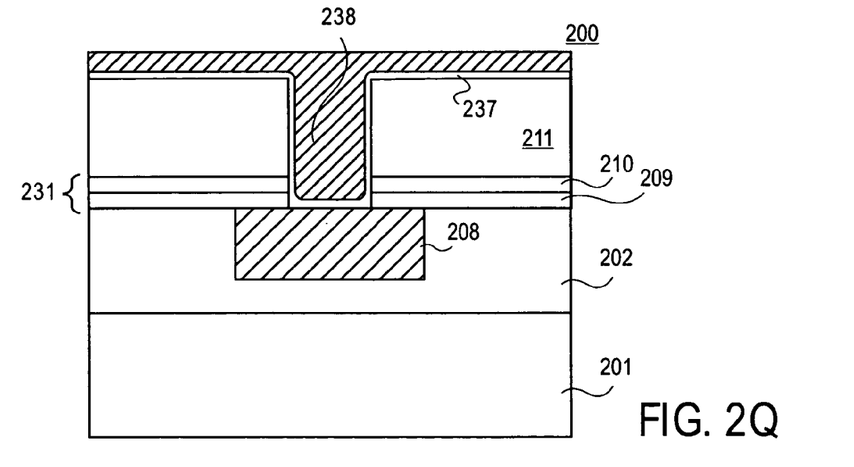
FIG. 2Q is a view similar to FIG. 2P, after the conductive layer is deposited into the opening according to another embodiment of the invention.

FIG. 2Q is a view 200 similar to FIG. 2P, after conductive layer 238 is deposited into opening 233 according to another embodiment of the invention. As shown in FIG. 2Q, conductive layer 238 is deposited onto conductive base layer 237 that covers the internal sidewalls and bottom of opening 233, as described above with respect to FIG. 2N.

FIG. 2O is a view 200 similar to FIG. 2N, after portions of conductive layer 218 and base layer 217 are removed from the top surface of ILD layer 211 outside opening 216 to form a an interconnect structure 218 according to one embodiment of the invention. Portions of conductive layer 218 may be removed chemically, e.g., using etching, mechanically, e.g., using polishing, or by a combination of thereof techniques, e.g., using a chemical-mechanical polishing ("CMP") technique known to one of ordinary skill in the art of microelectronic device manufacturing. As shown in FIG. 2O, interconnect structure 219 provides electrical connection between conductive elements on the top surface of ILD layer 211 and conductive line 208. As shown in FIG. 2O, interconnect structure 219 has a conductive via 229 portion and conductive trench 228 portion. In one embodiment, interconnect structure 219 is formed using a dual damascene technique to form via 229 and trench 228 in the same process, as described above.

In one embodiment, one or more interconnect structures are formed in ILD layer 211 using methods described above.

Figure 2R:
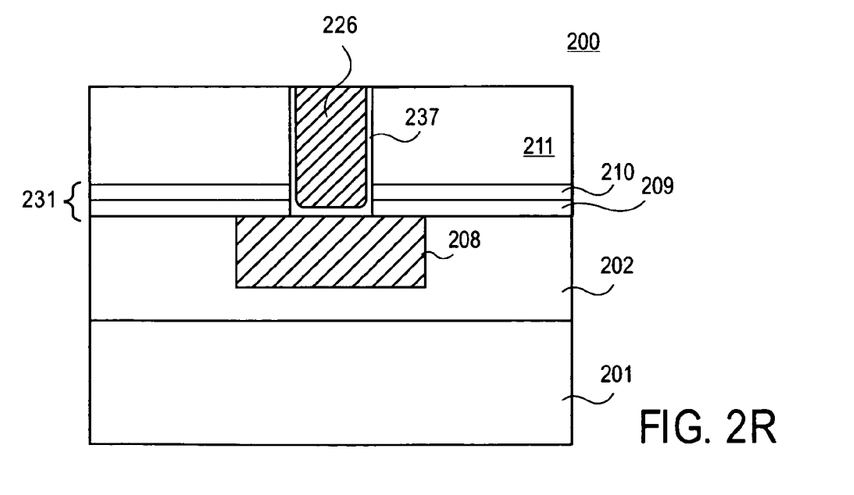
FIG. 2R is a view similar to FIG. 2Q, after portions of the conductive layer are removed from the top surface of the ILD layer to form an interconnect structure according to another embodiment of the invention.

FIG. 2R is a view 200 similar to FIG. 2Q, after portions of conductive layer 238 and base layer 237 are removed from the top surface of ILD layer 211 outside of opening 233 to form an interconnect structure 226 according to another embodiment of the invention. As shown in FIG. 2R, interconnect structure 226 includes a via and is formed using methods described above.

In the foregoing specification, embodiments of the invention have been described with reference to specific exemplary embodiments thereof. It will be evident that various modifications may be made thereto without departing from the broader spirit and scope of the invention. The specification and drawings are, accordingly, to be regarded in an illustrative sense an a restrictive sense.

What is claimed is:

1. A method, comprising:

forming a bi-layer over a copper conductive layer in a first interlayer dielectric (ILD) layer on a substrate, wherein the bi-layer comprises a compressive silicon carbide nitride layer on a tensile silicon nitride layer having a tensile stress in the range of 50 Megapascals to 900 Megapascals, wherein the compressive silicon carbide nitride layer is configured to compensate for the tensile silicon nitride layer, and wherein the tensile silicon nitride layer is deposited onto the copper conductive layer and the first ILD layer, wherein the copper conductive layer is deposited in the first ILD layer on the substrate to form one or more conductive lines; and forming a second interlayer dielectric (ILD) layer on the compressive silicon carbide nitride layer, wherein the bi-layer comprising the compressive silicon carbide nitride layer on the tensile silicon nitride layer adds the tensile stress at the copper conductive layer and increases adhesion between the copper conductive layer, the first ILD layer and the second ILD layer and is capable of being an etch stop layer.

2. The method of claim 1, further comprising:

forming a first opening in the second ILD layer using a first chemistry; and forming a second opening in the tensile silicon nitride layer and the compressive silicon carbide nitride layer using a second chemistry.

3. The method of claim 1, wherein the forming the tensile silicon nitride layer includes using a plasma enhanced chemical vapor deposition having a first RF frequency.

4. The method of claim 1, wherein the forming the compressive silicon carbide nitride layer includes using a plasma enhanced chemical vapor deposition having a second RF frequency.

5. A method to fabricate an interconnect, comprising:
depositing a tensile/compressive capping bi-layer on a first copper conductive layer in a first interlayer dielectric (ILD) layer on a substrate, wherein the depositing the bi-layer includes
  depositing a tensile silicon nitride layer having a tensile stress in the range of 50 Megapascals to 900 Megapascals on the first copper conductive layer and the first ILD layer; and
  depositing a compressive silicon carbide nitride layer on the tensile silicon nitride layer to compensate for the tensile silicon nitride layer;
  depositing a second interlayer dielectric (ILD) layer on the bi-layer, wherein the bi-layer comprising the compressive silicon carbide nitride on the tensile silicon nitride adds the tensile stress at the first copper conductive layer and increases adhesion between the first copper conductive layer, the first ILD layer, and the second ILD layer; and
  selectively etching the second ILD layer down to the bi-layer to form a first opening, wherein the bi-layer acts as an etch stop layer.

6. The method of claim 5, wherein the tensile silicon nitride layer and the compressive silicon carbide nitride layer are deposited using a plasma enhanced chemical vapor deposition.

7. The method of claim 5, further comprising
etching the bi-layer down to the first copper conductive layer through the first opening; and
depositing a second conductive layer in the first opening.

8. The method of claim 5, further comprising
etching the second ILD layer to form a second opening;
etching a portion of the bi-layer exposed through the first opening down to the first copper conductive layer;
depositing a base layer in the first opening and the second opening; and
depositing a conductive material onto the base layer.

9. An apparatus, comprising:
a bi-layer over a first copper conductive layer in a first interlayer dielectric (ILD) layer on a substrate, wherein the first copper conductive layer is deposited in the first ILD layer on the substrate to form one or more conductive lines, and wherein the bi-layer comprises a compressive silicon carbide nitride layer on a tensile silicon nitride layer having a tensile stress in the range of 50 Megapascals to 900 Megapascals, wherein the compressive silicon carbide nitride layer is configured to compensate for the tensile silicon nitride layer, and wherein the tensile silicon nitride layer is deposited onto the copper conductive layer and the first ILD layer on the substrate; and
a second interlayer dielectric (ILD) layer on the compressive silicon carbide nitride layer, wherein the bi-layer adds the tensile stress at the first copper conductive layer and increases adhesion between the first copper conductive layer, the first ILD layer, and the second ILD layer and is capable of being an etch stop layer.

10. The apparatus of claim 9, further comprising an interconnect structure in the first ILD layer to connect to the first conductive layer.

11. The apparatus of claim 9, wherein the tensile silicon nitride layer has a thickness in the range from 25 Angstroms to 100 Angstroms.

12. The apparatus of claim 9, wherein the compressive silicon carbide nitride layer has a thickness in the range from 100 Angstroms to 2000 Angstroms.

13. The apparatus of claim 9, wherein the the compressive layer has a compressive stress in the range from 50 Megapascals to 1 Gigapascal.

14. A method, comprising:
forming a compressive silicon carbide nitride layer on a tensile silicon nitride layer having a tensile stress in the range of 50 Megapascals to 900 Megapascals, wherein the tensile silicon nitride layer is deposited onto a copper conductive layer in a first interlayer dielectric (ILD) layer on a substrate, wherein the compressive silicon carbide nitride layer is configured to compensate for the tensile silicon nitride layer, and wherein the copper conductive layer is deposited in the first ILD layer on the substrate to form one or more conductive lines; and
forming a second interlayer dielectric (ILD) layer on the compressive silicon carbide nitride layer, wherein the compressive silicon carbide nitride layer on the tensile silicon nitride layer adds the tensile stress at the copper conductive layer and increases adhesion between the copper conductive layer, the first ILD layer, and the second ILD layer and is capable of being an etch stop layer.

* * * * *